United States Patent
High et al.

(10) Patent No.: US 10,571,225 B2
(45) Date of Patent: Feb. 25, 2020

(54) SYSTEM AND METHOD FOR CAMOUFLAGING AND RECHARGING AUTONOMOUS VEHICLES

(71) Applicant: Walmart Apollo, LLC, Bentonville, AR (US)

(72) Inventors: Donald R. High, Noel, MO (US); John J. O'Brien, Farmington, AR (US)

(73) Assignee: Walmart Apollo, LLC, Bentonville, AR (US)

( * ) Notice: Subject to any disclaimer, the term of this patent is extended or adjusted under 35 U.S.C. 154(b) by 0 days.

(21) Appl. No.: 15/812,803

(22) Filed: Nov. 14, 2017

(65) Prior Publication Data
US 2018/0142992 A1 May 24, 2018

Related U.S. Application Data

(60) Provisional application No. 62/425,124, filed on Nov. 22, 2016.

(51) Int. Cl.
*F41H 3/00* (2006.01)
*G05D 1/02* (2006.01)
(Continued)

(52) U.S. Cl.
CPC .............. *F41H 3/00* (2013.01); *B64C 39/024* (2013.01); *G05D 1/0202* (2013.01); *G09F 21/08* (2013.01);
(Continued)

(58) Field of Classification Search
CPC ........ B64C 2201/042; B64C 2201/128; B64C 39/024; B64D 2211/00; F41H 3/00;
(Continued)

(56) References Cited

U.S. PATENT DOCUMENTS 5,886,688 A * 3/1999 Fifield ................. G02F 1/13318
345/206
6,868,314 B1 3/2005 Frink
(Continued)

FOREIGN PATENT DOCUMENTS

| KR | 20160000378 | 1/2016 |
| WO | 2014080388 | 5/2014 |
| WO | 2015199535 | 12/2015 |

OTHER PUBLICATIONS

"Picosun develops ALD for graphene-based displays and electronics"; https://www.printedelectronicsworld.com/articles/6201/picosun-develops-ald-for-graphene-based-displays-and-electronics; Jan. 27, 2014; pp. 1-2.
(Continued)

*Primary Examiner* — Francis Geroleo
(74) *Attorney, Agent, or Firm* — Fitch, Even, Tabin & Flannery LLP (57) ABSTRACT

An unmanned autonomous vehicle is configured to delivery packages in a product delivery network. The vehicle includes an outer housing, a conversion circuit, a battery, and a control circuit. The outer housing includes a first layer that is configured to collect solar radiation, and a second layer that is configured to render a visual display. The conversion circuit is disposed within the outer housing, and is coupled to the first layer. The conversion circuit is configured to convert the collected solar radiation to electrical charge and store the charge in a battery. The control circuit is coupled to the second layer and is configured to independently determine one or more images to render at the second layer, and to cause the one or more images to be rendered at the second layer. The solar radiation is collected at the first layer simultaneously with the images being rendered at the second layer.

15 Claims, 5 Drawing Sheets

(51) Int. Cl.
| | |
|---|---|
| B64C 39/02 | (2006.01) |
| G09F 21/08 | (2006.01) |
| H02J 7/35 | (2006.01) |
| H01L 31/0216 | (2014.01) |
| H04N 5/232 | (2006.01) |
| H01L 31/02 | (2006.01) |
| H02S 40/38 | (2014.01) |
| G09F 27/00 | (2006.01) |
| G09F 21/10 | (2006.01) |
| G09F 9/33 | (2006.01) |

(52) U.S. Cl.
CPC ............ *G09F 21/10* (2013.01); *G09F 27/005* (2013.01); *G09F 27/007* (2013.01); *H01L 31/02021* (2013.01); *H01L 31/02168* (2013.01); *H02J 7/35* (2013.01); *H02S 40/38* (2014.12); *H04N 5/23293* (2013.01); *B64C 2201/042* (2013.01); *B64C 2201/128* (2013.01); *B64D 2211/00* (2013.01); *G09F 9/33* (2013.01); *Y02T 50/55* (2018.05)

(58) Field of Classification Search
CPC ....... G05D 1/0202; G09F 21/08; G09F 21/10; G09F 27/005; G09F 27/007; G09F 9/33; H01L 31/02021; H01L 31/02168; H02J 7/35; H04N 5/23293
See application file for complete search history.

(56) References Cited

U.S. PATENT DOCUMENTS

| | | | |
|---|---|---|---|
| 9,550,577 B1 | 1/2017 | Beckman | |
| 9,573,684 B2 | 2/2017 | Kimchi | |
| 9,643,722 B1* | 5/2017 | Myslinski | B64C 39/024 |
| 10,109,224 B1* | 10/2018 | Ratti | G09G 3/005 |
| 2008/0053094 A1 | 3/2008 | Palmer | |
| 2008/0248191 A1 | 10/2008 | Daniels | |
| 2009/0071533 A1 | 3/2009 | Choi | |
| 2009/0140098 A1 | 6/2009 | Lengsfeld | |
| 2009/0154777 A1 | 6/2009 | Cincotti | |
| 2009/0194634 A1 | 8/2009 | Stelte | |
| 2015/0120094 A1 | 4/2015 | Kimchi | |
| 2015/0241176 A1 | 8/2015 | Schwarz | |
| 2015/0248711 A1 | 9/2015 | Fournier | |
| 2015/0277440 A1 | 10/2015 | Kimchi | |
| 2016/0196755 A1 | 7/2016 | Navot | |
| 2016/0257401 A1 | 9/2016 | Buchmueller | |
| 2016/0368613 A1* | 12/2016 | Rives | B64D 33/00 |
| 2017/0110017 A1 | 4/2017 | Kimchi | |
| 2017/0144758 A1* | 5/2017 | Myslinski | B64C 39/024 |
| 2018/0037321 A1* | 2/2018 | Wilkinson | B64C 39/024 |
| 2018/0251218 A1* | 9/2018 | Wilkinson | B64C 39/024 |

OTHER PUBLICATIONS

Ditiangkin, Paul; "Organic Light-Emitting Diodes and Organic Photovoltaics"; http://large.stanford.edu/courses/2013/ph240/ditiangkin2/; Dec. 9, 2013; pp. 1-3.

Feist, Jonathan; "Why is Samsung's breakthrough in graphene research so promising for next generation electronics?"; https://www.androidauthority.com/samsung-graphene-364824/; Apr. 4, 2014; pp. 1-4.

Frey, Thomas; "192 Future Uses for Flying Drones"; http://www.futuristspeaker.com/business-trends/192-future-uses-for-flying-drones/; Sep. 2, 2014; pp. 1-13.

Hambling, David; "How Active Camouflage Will Make Small Drones Invisible"; http://www.popularmechanics.com/flight/drones/a18190/active-camouflage-make-small-drones-invisible/; Nov. 14, 2015; pp. 1-5.

Marcus, Jennifer; "Scientists create highly transparent solar cells for windows that generate electricity"; https://phys.org/news/2012-07-scientists-highly-transparent-solar-cells.html; Jul. 20, 2012; pp. 1-2.

Mertens, Ron; "Nanometer Graphene can be used to make better and cheaper large-area OLEDs"; https://www.oled-info.com/nanometer-graphene-can-be-used-make-better-and-cheaper-large-area-oleds; Mar. 9, 2010; pp. 1-2.

PCT; App. No. PCT/US2017/062181; International Search Report and Written Opinion dated Feb. 2, 2018.

Stauffer, Nancy W.; "Transparent solar cells: Generating power from everyday surfaces"; http://energy.mit.edu/news/transparent-solar-cells/; Jun. 20, 2013; pp. 1-8.

Torres, JC; "LG shows off 18-inch flexible, transparent OLED display"; https://www.slashgear.com/lg-shows-off-18-inch-flexible-transparent-oled-display-10336924/; Jul. 10, 2014; pp. 1-3.

Truta, Filip; "Apple Taps Seoul Researchers to Use Graphene in Potential Flexible Devices"; http://news.softpedia.com/news/Apple-Taps-Seoul-Researchers-to-Use-Graphene-in-Potential-Flexible-Devices-Bloomberg-442542.shtml; May 16, 2014; pp. 1-2.

* cited by examiner

SYSTEM AND METHOD FOR CAMOUFLAGING AND RECHARGING AUTONOMOUS VEHICLES

CROSS-REFERENCE TO RELATED APPLICATION

This application claims the benefit of the following U.S. Provisional Application No. 62/425,124 filed Nov. 22, 2016, which is incorporated herein by reference in its entirety.

TECHNICAL FIELD

This invention relates generally to autonomous vehicles, and more particularly, to camouflaging these vehicles within their operating environment.

BACKGROUND

Drones have been deployed to public air space, and the protection of drones within this air space is a growing concern. More specifically, individuals or organizations may try to capture, damage, or destroy drones as they operate. These nefarious acts are obviously costly to the drone owners, but also increase customer costs and delivery schedules when the drones are used in delivery services.

One way to prevent loss or damage to the drone is to camouflage the drone. Through the years, various type of approaches have been used to camouflage drones. For example, a drone may be painted in a way that seeks to hide the drone within its environment. However, once applied the paint cannot be easily or quickly changed. Consequently, the appearance of the drone does not change as its environment changes, and the drone may be easily located by individuals seeking to capture or harm the drone.

BRIEF DESCRIPTION OF THE DRAWINGS

Disclosed herein are embodiments of systems, apparatuses and methods pertaining to camouflaging drones or other unmanned autonomous vehicles. This description includes drawings, wherein.

Elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention. Certain actions and/or steps may be described or depicted in a particular order of occurrence while those skilled in the art will understand that such specificity with respect to sequence is not actually required. The terms and expressions used herein have the ordinary technical meaning as is accorded to such terms and expressions by persons skilled in the technical field as set forth above except where different specific meanings have otherwise been set forth herein.

DETAILED DESCRIPTION

Generally speaking, pursuant to various embodiments, systems, apparatuses and methods are provided herein for camouflaging autonomous vehicles such as drones or automated ground vehicles. More specifically, various types of images are selectively on these vehicles, and the determination of the image is made at the vehicle. Simultaneous with the image display, incident solar radiation is captured, converted into electrical charge, and stored at a battery at the vehicle.

Advantageously, drones or other autonomous vehicles are effectively disguised while they operate in the air, making them virtually invisible to observers. Additionally, various types of marketing information and other announcements can be displayed at the drone.

In one example and through the use of video cameras and analytics, an image (or images) of the surrounding environment of a drone is captured. Then, this image is projected through the outer housing (skin). The skin may be constructed of lightweight materials or structures such as combinations of organic light emitting diode (OLED) layers, solar panel layers, and graphene to mention a few examples. To take one specific example, if a drone is flying within an urban environment, onboard cameras will capture the surrounding urban environment, the information will be processed, and then project this image through its armor skin. In another example, if the exterior environment is particularly blue (due to a blue daytime sky), the drone will change its armor skin to blue.

Marketing or other types of messages can also be displayed. These images can be received from a host or stored in a data repository, which then is projected through the drone's skin. Among others, retailers or other vendors can have images displayed at the drone.

Not only will this lightweight-flexible armor skin provide a dynamic display of the environment or marketing information, but it will also aid in replenishing the drone's battery power through solar panel charging. In other words, image display and recharging using the same outer housing or skin is simultaneously performed.

In some embodiments, an unmanned autonomous vehicle (e.g., aerial drone or unmanned ground vehicle) is configured to delivery packages in a product delivery network. The vehicle includes an outer housing, a conversion circuit, a battery, and a control circuit. The outer housing includes a first layer that is configured to collect solar radiation, and a second layer that is configured to render a visual display. The conversion circuit is disposed within the outer housing, and is coupled to the first layer. The conversion circuit is configured to convert the collected solar radiation to electrical charge. The battery is disposed within the outer housing and is coupled to the conversion circuit. The battery is configured to store the electrical charge. The control circuit is coupled to the second layer. The control circuit is configured to independently determine one or more images to render at the second layer, and to cause the one or more images to be rendered at the second layer. The solar radiation is collected at the first layer simultaneously with the images being rendered at the second layer.

In some examples, the first layer and the second layer comprise a single layer. In aspects, the first layer and the second layer are constructed of a layer of bonded carbon atoms in a sheet. In other examples, the first layer and the second layer are constructed of different materials. For example, the second layer is an organic light emitting diode (OLED) layer comprising a plurality of OLEDs.

In aspects, the one or more images are effective to camouflage the unmanned autonomous vehicle within its environment. In some examples, the one or more images comprise an advertisement or marketing information. In other examples, the one or more images comprise first images that are effective to camouflage the unmanned autonomous vehicle within its environment, and second images, the second images including an advertisement or marketing information.

In some examples, the unmanned autonomous vehicle further includes a protective layer. In aspects, the protective layer comprises a nanotube. Other examples are possible.

In other examples, the unmanned autonomous vehicle further includes a camera that is configured to obtain exterior images of the external environment of the unmanned autonomous aerial vehicle. The control circuit determines the images to be rendered at the second layer based upon the exterior images obtained by the camera.

In others of these embodiments, an apparatus is configured to simultaneously re-charge a battery and display an image. The apparatus includes a first layer, a second layer, a conversion circuit, a battery, and a control circuit.

The first layer is configured to collect solar radiation. The second layer is adjacent to the first layer and is configured to render a visual display.

The conversion circuit is coupled to the first layer and is configured to convert the collected solar radiation to electrical charge. The battery is coupled to the conversion circuit, and is configured to store the electrical charge.

The control circuit is coupled to the second layer. The control circuit is configured to independently determine one or more images to render at the second layer, and to cause the one or more images to be rendered at the second layer. The solar radiation is collected at the first layer simultaneously with the images being rendered at the second layer.

In aspects, the first layer and the second layer comprise a single layer. In other aspects, the first layer and the second layer are constructed of a layer of bonded carbon atoms in a sheet. In still other aspects, the first layer and the second layer are constructed of different materials. In still other examples, the second layer is an organic light emitting diode (OLED) layer comprising a plurality of OLEDs.

In other examples, the one or more images are effective to camouflage an unmanned autonomous vehicle within its environment, or the one or more images comprise an advertisement or marketing information.

In other examples, the apparatus includes a protective layer. In aspects, the protective layer comprises a nanotube.

Figure 1:
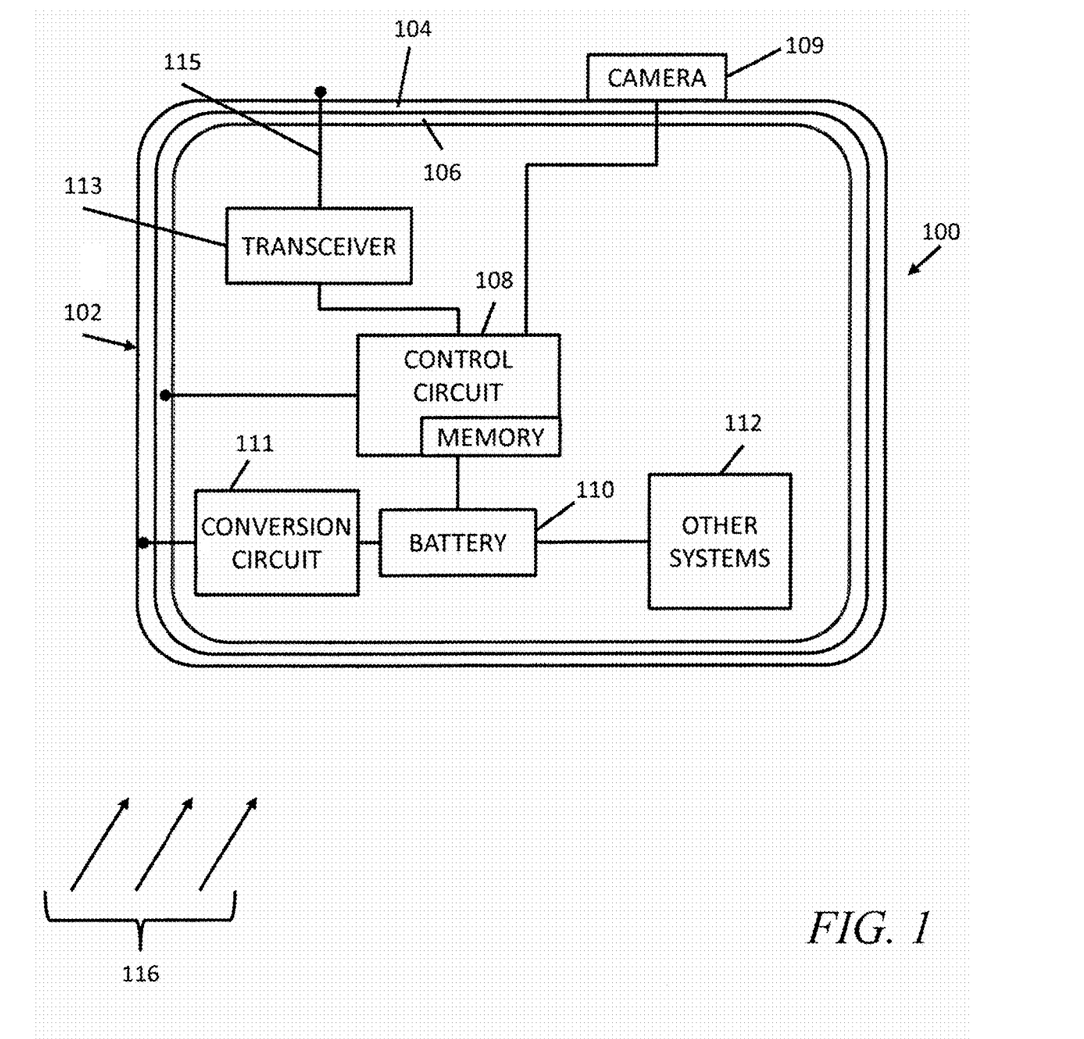
FIG. 1 is a block diagram of an autonomous vehicle such as an aerial drone in accordance with some embodiments.

Referring now to FIG. 1, one example of an autonomous vehicle 100 such as an aerial drone (or ground vehicle) is described. The autonomous vehicle 100 includes an outer housing (or skin) 102 with a first layer 104 and a second layer 106. The autonomous vehicle 100 also includes a control circuit 108, a camera 109, a battery 110, a conversion circuit 111, other systems 112, a transceiver 113, and an antenna 115. It will be appreciated that the structures described herein can be deployed at any location or with any type of device.

The first layer 104 may be a solar panel layer that is configured to capture solar energy 116. The first layer 104 is coupled to the conversion circuit 111. The second layer 106 may be an image display layer, which is configured to display images. The second layer 106 is coupled to the control circuit 108. In one example, the image display layer is an OLED layer. Other examples are possible.

In other aspects, the first layer 104 and the second layer are combined into a single layer that simultaneously collects solar energy and displays images. For instance, a single layer of graphene may be used. In yet other aspects, additional layers can be added. For instance, a protective layer may be added to the outer housing 102.

The camera 109 captures exterior images, which may be used as part of the images that will be displayed at the second layer 106. The battery 110 stores electrical charge. The conversion circuit 111 converts stored solar energy in the first layer 104 into electrical charge, which can be stored at the battery 110.

The other systems 112 include other systems used by the autonomous vehicle 100 to operate or navigate. For example these additional systems 112 may include propulsion systems (e.g. a propeller when the vehicle 100 is an aerial drone), and an engine to mention two examples.

The transceiver 113 may transmit and receive communications or signals via the antenna 115. For instance, the transceiver 113 may receive signals (e.g., from a GPS satellite system) that specify or indicate the geographic location of the autonomous vehicle 100. Signals indicating the time of day may also be received (or obtained from an internal clock in the autonomous vehicle 100). As explained elsewhere herein, this information may be used by the control circuit in determining images to be displayed at the second layer 106. Additionally, images may be uploaded via the transceiver 113. For example, advertisements may be uploaded for display.

The term control circuit refers broadly to any microcontroller, computer, or processor-based device with processor, memory, and programmable input/output peripherals, which is generally designed to govern the operation of other components and devices. It is further understood to include common accompanying accessory devices, including memory, transceivers for communication with other components and devices, etc. These architectural options are well known and understood in the art and require no further description here. The control circuit 108 may be configured (for example, by using corresponding programming stored in a memory as will be well understood by those skilled in the art) to carry out one or more of the steps, actions, and/or functions described herein.

The control circuit 108 determines the images to be displayed. In these regards, the control circuit 108 determines or obtains parameters in order to make a determination as to what image (or images) to display at the outer housing (skin) of the autonomous vehicle. For example, the determination may be made based on geographic location (e.g., camouflage and an advertisement displayed at certain geographic locations), or time of day (e.g., camouflage and an advertisement displayed at certain times). In still another example, camouflage is always displayed at the autonomous vehicle. This information can be obtained from the camera 109, communications received at the transceiver 113, or internally (e.g., by an internal clock).

In other aspects, the control circuit 108 determines images to be displayed at multiple areas of the outer housing of the autonomous vehicle. More specifically, the outer housing 102 may be divided into different areas with different types of images. For example, at certain times and locations, the underside of the autonomous vehicle 100 may display camouflage images in some areas, while displaying an advertisement in other areas of the underside. The top portion of the autonomous vehicle 100 may display only camouflage images. Further, at certain times (e.g., nighttime) no images of any type may be displayed.

In other examples, the control circuit 108 determines an image source to use for the images it will display. For example, the camera 109 can obtain images of the exterior environment of the autonomous vehicle 100, and these images can be used as the images to display at the exterior of the autonomous vehicle 100 at the second layer 106. The camera 109 may obtain images of the sky (e.g., a blue sky or a cloudy sky) and these images used. In other examples, the autonomous vehicle 100 is pre-programmed with images to be displayed. In this example, the control circuit includes a memory that stores these images.

Advertisements and other messages may also be displayed. The display of these images may be based upon location, time of day, or amount paid to display the image to mention a few examples.

It will be appreciated that the images displayed may be dynamically changed by a wide variety of factors. For example, new advertisements can be loaded via the transceiver 113 as new customers wish to have these advertisements displayed.

In one example of the operation of the autonomous vehicle 100, the conversion circuit 100 converts collected solar radiation from the first layer 104 into electrical charge, and stores the charge in battery 110. The control circuit 108 is configured to independently determine one or more images to render at the second layer 106, and to cause the one or more images to be rendered at the second layer 106. The solar radiation is collected at the first layer 104 simultaneously with the images being rendered at the second layer 106.

Figure 2:
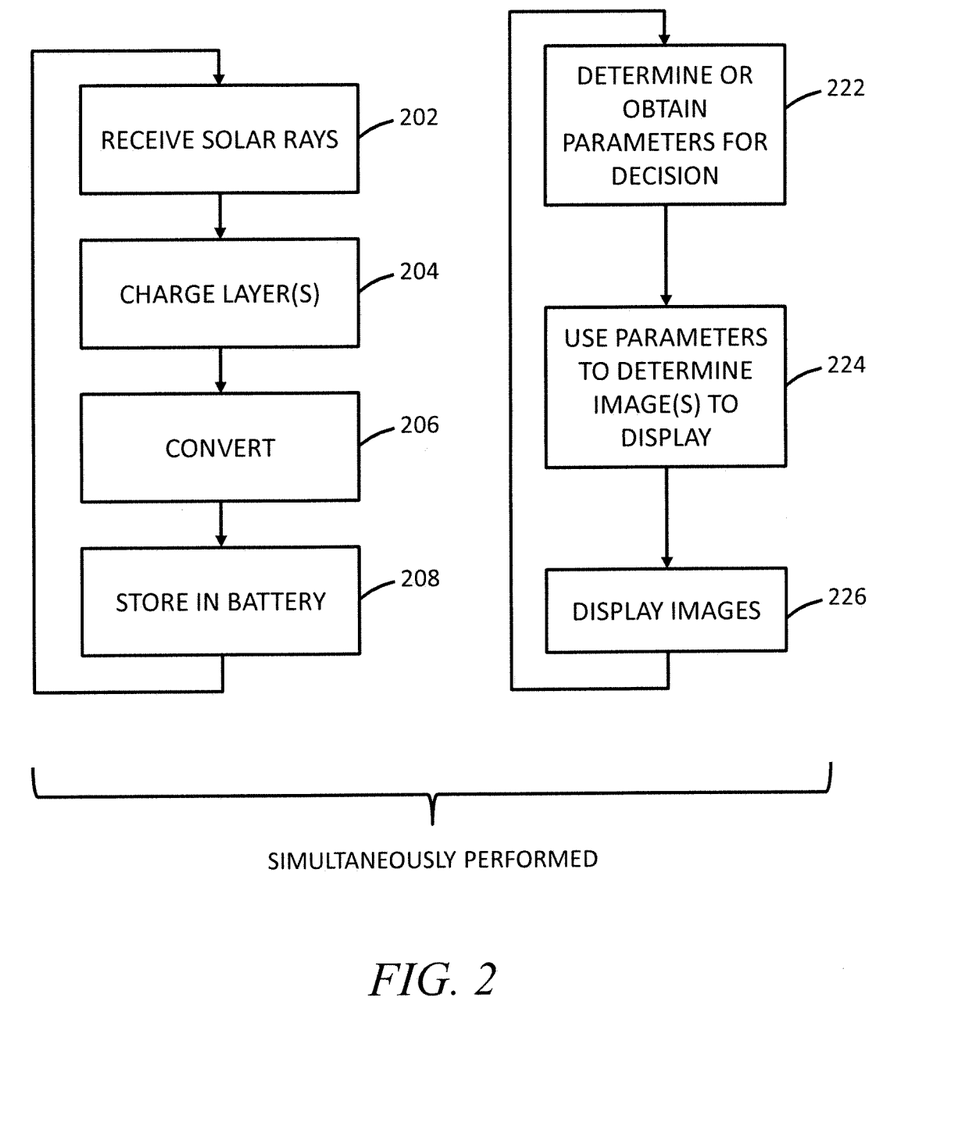
FIG. 2 is a flowchart showing an approach for simultaneously camouflaging and recharging and autonomous vehicle in accordance with some embodiments.

Referring now to FIG. 2, one example of approach for simultaneously camouflaging and recharging an autonomous vehicle is described. Two sequences of steps are performed simultaneously and in parallel. More specifically, steps 202, 204, 206, and 208 are performed simultaneously and in parallel with steps 222, 224, and 226.

Steps 202, 204, 206, and 208 relate to recharging the battery of the autonomous vehicle. At step 202, solar rays are received at the autonomous vehicle. Specifically, the solar rays are received at the outer housing (skin) of the autonomous vehicle. At step 204, the solar energy of the rays is captured and stored in one or more layers of the outer housing (skin) of the autonomous vehicle.

At step 206, the stored energy is converted into electrical charge. At step 208, the charge created at step 206 is stored in a battery at the autonomous vehicle.

Steps 202, 204, 206, and 208 relate to the determination of image(s) to be displayed at the autonomous vehicle. At step 202, the autonomous vehicle determines or obtains parameters in order to make a determination as to what image (or images) to display at the outer housing (skin) of the autonomous vehicle. For example, the determination may be made based on the geographic location of the autonomous vehicle (e.g., camouflage and an advertisement displayed at certain geographic locations). In another example, the determination may be made based on time of day (e.g., camouflage and an advertisement displayed at certain times). In still another example, camouflage is always displayed at the autonomous vehicle.

In other aspects, the autonomous vehicle determines the images to be displayed at multiple areas of the outer housing of the autonomous vehicle. For example, at certain times and locations, the underside of the autonomous vehicle may display camouflage images in some areas, while displaying an advertisement in other areas of the underside. The top portion of the autonomous vehicle may display only camouflage images. Further, at certain times (e.g., nighttime) no images of any type may be displayed.

In other examples, the autonomous vehicle determines an image source to use. For example, a camera can obtain images of the exterior environment of the autonomous vehicle, and these images can be used as the images to display at the exterior of the autonomous vehicle. The camera may obtain images of the sky (e.g., a blue sky or a cloudy sky) and these images used. In other examples, the autonomous vehicle is pre-programmed with images to be displayed.

Advertisements and other messages may also be displayed. The display of these images may be based upon location, time of day, or amount paid to display the image to mention a few examples.

At 226, the images are selectively displayed at the outer housing of the autonomous vehicle. For example, an OLED layer may be used. In another example, a graphene layer may be used (that is also simultaneously used to collect solar radiation to charge the battery of the autonomous vehicle).

Figure 3A:
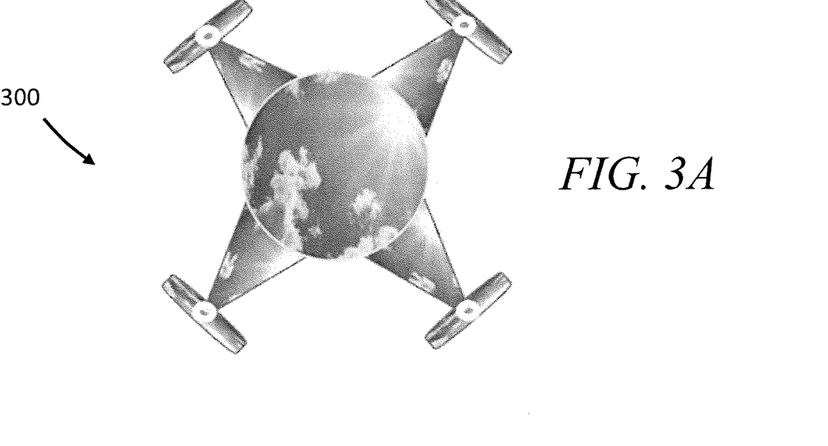
FIG. 3A is a drawing showing one example of camouflaging an aerial drone in accordance with some embodiments.

Referring now to FIG. 3A, one example of an aerial drone 300 that is camouflaged is described. In this example, the bottom of the drone 300 (facing the ground and an observer on the ground) is shown. The bottom of the drone 300 is completely covered by an image of the sky and the sun. In this way, the drone 300 may be hidden from observers on the ground.

Figure 3B:
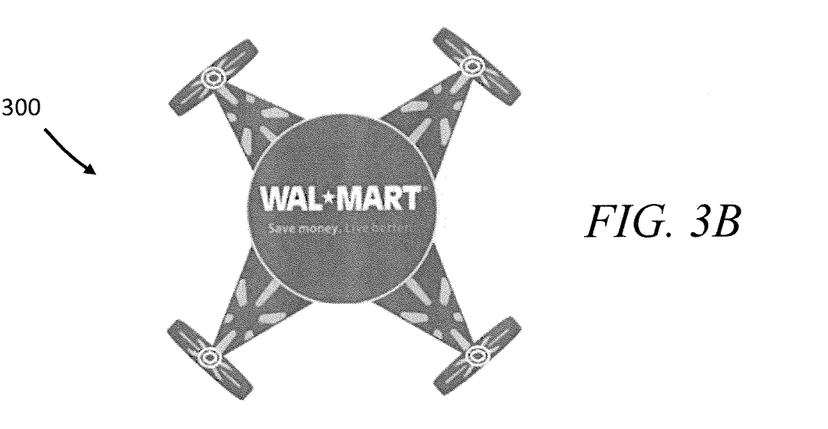
FIG. 3B is a drawing showing another example of camouflaging an aerial drone in accordance with some embodiments.

Referring now to FIG. 3B, another example of an aerial drone 300 that is camouflaged is described. In this example, the bottom of the drone 300 (facing the ground and an observer on the ground) is shown. The bottom of the drone 300 is partially covered by an image of the sky and the sun. However, the center portion of the drone includes an advertisement. In this way, the drone 300 may be hidden from observers on the ground, but still include advertising (or other messages).

It will be appreciated that although the examples of FIG. 3A and FIG. 3B show an aerial drone, the same approaches can be used for ground vehicles as well.

Figure 4:
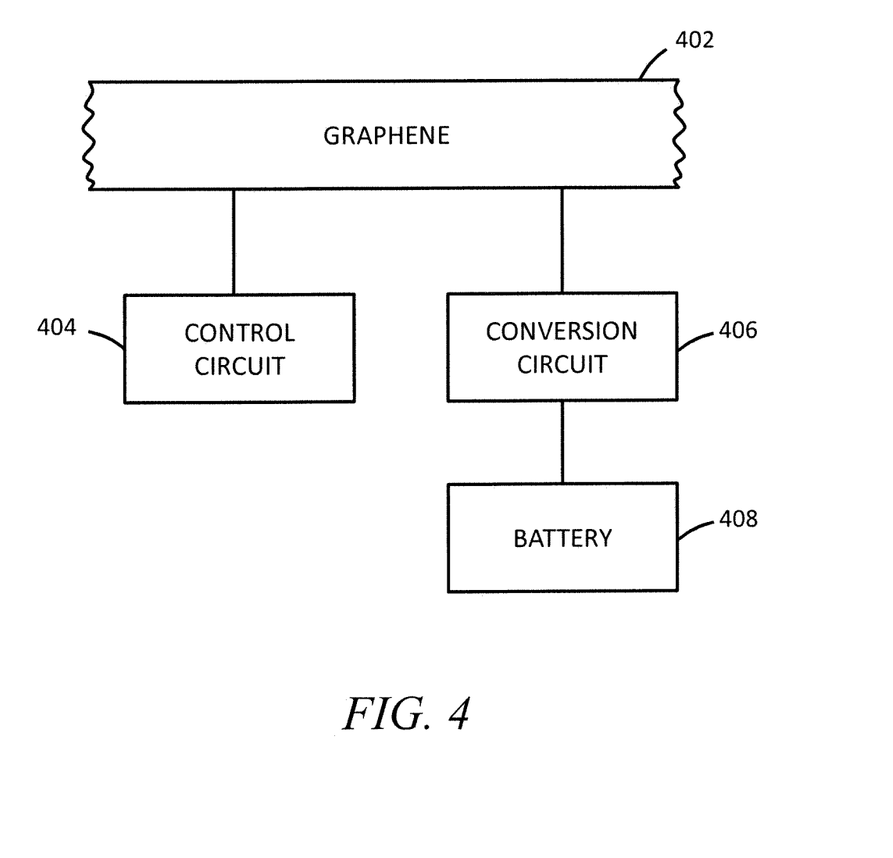
FIG. 4 is a drawing showing one example of the outer housing of an autonomous vehicle in accordance with some embodiments.

Referring now to FIG. 4, a graphene layer 402 (bonded carbon atoms derived from graphite) is used as the outer housing or skin of the drone. This outer housing encloses various internal components of the done. The graphene layer 402 simultaneously collects solar radiation and displays images. The graphene layer is ultra-lightweight and approximately 200 times stronger than steel. Further, the graphene layer 402 is flexible, thin, and a conductor of electricity. Additionally, the graphene layer 402 is virtually impenetrable. For example, not even helium can pass through this layer. The graphene layer 402 can also be used as a semiconductor, to process water through for onboard environment control functions (e.g., air conditioning), touch screens, and a battery source for storing solar charges. Other examples are possible.

A control circuit 404 is enclosed by the graphene layer 402. The control circuit 404 determines the images to be displayed. In these regards, the control circuit 404 determines or obtains parameters in order to make a determination as to what image (or images) to display at the outer housing (skin) of the autonomous vehicle. For example, the determination may be made based on geographic location (e.g., camouflage and an advertisement displayed at certain geographic locations), or time of day (e.g., camouflage and an advertisement displayed at certain times). In still another example, camouflage is always displayed at the autonomous vehicle.

In other aspects, the control circuit 404 determines images to be displayed at multiple areas of the outer housing of the autonomous vehicle. For example, at certain times and locations, the underside of the autonomous vehicle may display camouflage images in some areas, while displaying an advertisement in other areas of the underside. The top portion of the autonomous vehicle may display only camouflage images. Further, at certain times (e.g., nighttime) no images of any type may be displayed.

In other examples, the control circuit 404 determines an image source to use for the images it will display. For example, a camera can obtain images of the exterior environment of the autonomous vehicle, and these images can be used as the images to display at the exterior of the autonomous vehicle. The camera may obtain images of the sky (e.g., a blue sky or a cloudy sky) and these images used. In other examples, the autonomous vehicle is pre-programmed with images to be displayed.

Advertisements and other messages may also be displayed. The display of these images may be based upon location, time of day, or amount paid to display the image to mention a few examples.

A conversion circuit 406 couples to the graphene layer 402 and is configured to convert solar energy into electrical charge. The electrical charge is stored in the battery 408.

Figure 5:
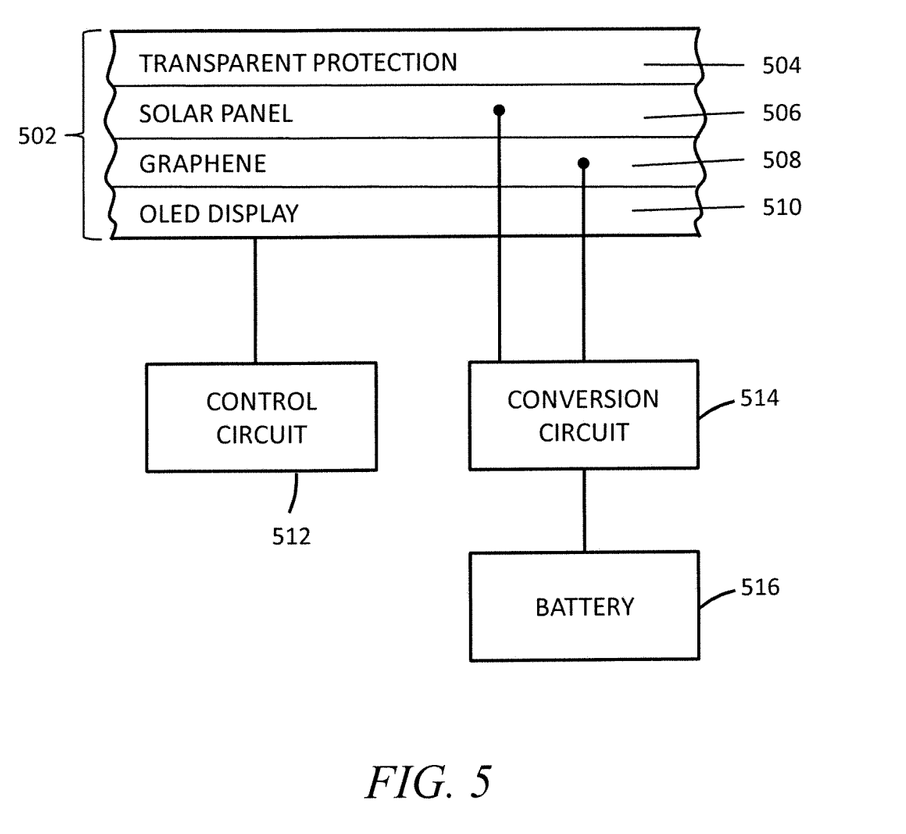
FIG. 5 is another example of the outer housing of an autonomous vehicle in accordance with some embodiments.

Referring now to FIG. 5, another structure 502 for the outer housing of an autonomous vehicle or disposed at some other location is described. The structure 502 includes a transparent protection layer 504, a solar panel layer 506, a graphene layer 508, and an OLED layer 510.

The transparent protection layer 504 acts to protect the other layers of the structure 502 and the internal components of the drone from environmental conditions, intrusion, or damage from collisions.

The solar panel layer 506 collects solar radiation. The graphene layer 508 also collects solar radiation. The graphene layer 508 is ultra-lightweight and approximately 200 times stronger than steel. The graphene layer 508 is flexible, thin, and a conductor of electricity. Additionally, the graphene layer 508 is virtually impenetrable. For example, not even helium can pass through it. The graphene layer 508 can also be used as a semiconductor, to process water through for onboard environment control functions (e.g., air conditioning), touch screens, and a battery source for storing solar charges. Other examples are possible.

The OLED layer 510 includes LEDs that display images to viewers. The images may be suitable to camouflage the drone, or may be advertisements or other types of messages to be displayed. A drive circuit (not shown) may be used to drive the OLED layer 510. The OLED layer may not be a continuous layer, but may include separately driven portions or sections. In other words, the outer housing (or skin) may not be a single display, but may be separated into several individually controlled sections where different images can be displayed. For example, some portions or sections may be used for camouflage purposes, and other portions or sections may be used to display advertisements. It will also be understood that the sections are dynamic and their displays change over time.

A control circuit 512 is enclosed by the outer housing structure 502. The control circuit 512 determines the images to be displayed. In these regards, the control circuit 512 determines or obtains parameters in order to make a determination as to what images(s) to display at the outer housing (skin) of the autonomous vehicle. For example, the determination may be made based on geographic location (e.g., camouflage and an advertisement displayed at certain geographic locations), or time of day (e.g., camouflage and an advertisement displayed at certain times). In still another example, camouflage is always displayed at the autonomous vehicle.

In other aspects, the control circuit 512 determines images to be displayed at multiple areas of the outer housing of the autonomous vehicle. For example, at certain times and locations, the underside of the autonomous vehicle may display camouflage images in some areas, while displaying an advertisement in other areas of the underside. The top portion of the autonomous vehicle may display only camouflage images. Further, at certain times (e.g., nighttime) no images of any type may be displayed.

In other examples, the control circuit 512 determines an image source to use for the images it will display. For example, a camera can obtain images of the exterior environment of the autonomous vehicle, and these images can be used as the images to display at the exterior of the autonomous vehicle. The camera may obtain images of the sky (e.g., a blue sky or a cloudy sky) and these images used. In other examples, the autonomous vehicle is pre-programmed with images to be displayed.

Advertisements and other messages may also be displayed. The display of these images may be based upon location, time of day, or amount paid to display the image to mention a few examples.

A conversion circuit 514 couples to the solar panel layer 506 and the graphene layer 508 and is configured to convert solar energy from these layers into electrical charge. The electrical charge is stored in the battery 516.

It will be appreciated that the structure 502 (and/or the control circuit 512, the conversion circuit 514, and the battery 516) may be disposed at other locations besides at autonomous vehicles. For example, the structure 502 may enclose (or partially enclose) the control circuit 512, the conversion circuit 514, and the battery 516, and may be disposed on a ceiling or wall (to mention two examples of possible permanent or semi-permanent locations).

Other elements may also be disposed within the enclosed structure 502 to provide other functions. For example, the structure 502 may provide the outer skin for a cellular phone, laptop, or tablet. Other examples are possible.

Those skilled in the art will recognize that a wide variety of other modifications, alterations, and combinations can also be made with respect to the above described embodiments without departing from the scope of the invention, and that such modifications, alterations, and combinations are to be viewed as being within the ambit of the inventive concept.

What is claimed is:

1. An unmanned autonomous vehicle configured to deliver packages in a product delivery network, the vehicle comprising:
   an outer housing, the outer housing including a first layer that is configured to collect solar radiation, the first layer being in communication with the external environment of the vehicle, a second layer that is constructed of a structurally enhancing material, the second layer disposed in parallel relation to and in contact with the first layer, the second layer also collecting solar radiation, and a third layer that is configured to render a visual display, wherein the third layer is disposed in parallel relation to and is in contact with the second layer, and the second layer and the third layer are not in communication with the external environment of the vehicle;

a conversion circuit disposed within the outer housing, the conversion circuit coupled to the first layer and the second layer, and configured to convert the collected solar radiation to electrical charge;

a battery disposed within the outer housing and coupled to the conversion circuit, the battery configured to store the electrical charge;

a control circuit coupled to the third layer, the control circuit configured to independently determine one or more images to render at the third layer, and to cause the one or more images to be rendered at the third layer;

wherein the solar radiation is collected at the first layer and the second layer simultaneously with the images being rendered at the third layer;

wherein the images are projected from the third layer through the first layer and the second layer for viewing by an observer in the external environment outside the vehicle;

wherein the third layer includes a first display area configured to display a first image and a second display area configured to display a second image;

wherein the content of the first image and the content of the second image are selected based upon a location of the vehicle and a time of day;

wherein at a first time and a first location, the content of the first image is camouflage and the second image is camouflage;

wherein at a second time and a second location, presentation of the first image is deactivated and presentation of the second image is deactivated;

wherein at a third time and a third location, the content of the first image is camouflage and the second image is an advertisement.

2. The unmanned autonomous vehicle of claim 1, wherein the first layer and the third layer are constructed of a layer of bonded carbon atoms in a sheet.

3. The unmanned autonomous vehicle of claim 1, wherein the first layer and the third layer are constructed of different materials.

4. The unmanned autonomous vehicle of claim 3, wherein the third layer is an organic light emitting diode (OLED) layer comprising a plurality of OLEDs.

5. The unmanned autonomous vehicle of claim 1, further comprising a protective layer.

6. The unmanned autonomous vehicle of claim 5, wherein the protective layer comprises a nanotube.

7. The unmanned autonomous vehicle of claim 1, further comprising a camera that is configured to obtain exterior images of the external environment of the unmanned autonomous vehicle, and wherein the control circuit determines the images to be rendered at the second layer based upon the exterior images obtained by the camera.

8. A method of operating an unmanned autonomous vehicle to deliver packages in a product delivery network, the method comprising:

collecting solar radiation at a first layer of an outer housing of the unmanned autonomous vehicle and at a second layer that is constructed of a structurally enhancing material, the second layer disposed in parallel relation to and in contact with the first layer, and simultaneously rendering a display at a third layer of the housing of the unmanned autonomous vehicle, the first layer being in communication with the external environment of the vehicle, wherein the third layer is disposed in parallel relation to and is in contact with the second layer, and the second and the third layer are not in communication with the external environment of the vehicle;

converting the collected solar radiation from the first layer and the second layer to electrical charge and storing the electrical charge in a battery;

at the unmanned autonomous vehicle, independently determining one or more images to render at the third layer, and to causing the one or more images to be rendered at the third layer;

wherein the images are projected from the third layer through the first layer and the second layer for viewing by an observer in the external environment outside the vehicle;

wherein the third layer includes a first display area configured to display a first image and a second display area configured to display a second image;

wherein the content of the first image and the content of the second image are selected based upon a location of the vehicle and a time of day;

wherein at a first time and a first location, the content of the first image is camouflage and the second image is camouflage;

wherein at a second time and a second location, presentation of the first image is deactivated and presentation of the second image is deactivated;

wherein at a third time and a third location, the content of the first image is camouflage and the second image is an advertisement.

9. The method of claim 8, wherein the first layer and the third layer are constructed of different materials.

10. An apparatus that is configured to simultaneously re-charge a battery and display an image, the apparatus comprising:

a first layer that is configured to collect solar radiation;

a second layer that is constructed of a structurally enhancing material, the second layer disposed in parallel relation to and in contact with the first layer, the second layer also collecting solar radiation;

a third layer adjacent to the second layer and configured to render a visual display;

wherein the first layer being in communication with the external environment of the vehicle;

wherein the third layer is disposed in parallel relation to and is in contact with the second layer, and the second layer and the third layer are not in communication with the external environment of the vehicle;

a conversion circuit coupled to the first layer and the second layer, and configured to convert the collected solar radiation to electrical charge;

a battery coupled to the conversion circuit, the battery configured to store the electrical charge;

a control circuit coupled to the third layer, the control circuit configured to independently determine one or more images to render at the third layer, and to cause the one or more images to be rendered at the third layer;

wherein the solar radiation is collected at the first layer and the second layer simultaneously with the images being rendered at the third layer;

wherein the images are projected from the third layer through the first layer and the second layer for viewing by an observer in the external environment outside the vehicle;

wherein the third layer includes a first display area configured to display a first image and a second display area configured to display a second image;

wherein the content of the first image and the content of the second image are selected based upon a location of the vehicle and a time of day;

wherein at a first time and a first location, the content of the first image is camouflage and the second image is camouflage;

wherein at a second time and a second location, presentation of the first image is deactivated and presentation of the second image is deactivated;

wherein at a third time and a third location, the content of the first image is camouflage and the second image is an advertisement.

11. The apparatus of claim 10, wherein the first layer and the third layer are constructed of a layer of bonded carbon atoms in a sheet.

12. The apparatus of claim 10, wherein the first layer and the third layer are constructed of different materials.

13. The apparatus of claim 10, wherein the third layer is an organic light emitting diode (OLED) layer comprising a plurality of OLEDs.

14. The apparatus of claim 10, further comprising a protective layer.

15. The apparatus of claim 14, wherein the protective layer comprises a nanotube.

\* \* \* \* \*